United States Patent
Lindenmeier et al.

(10) Patent No.: US 9,287,846 B2
(45) Date of Patent: Mar. 15, 2016

(54) ANALOG PHASE SHIFTER

(75) Inventors: Stefan Lindenmeier, Gauting-Buchendorf (DE); Heinz Lindenmeier, Planegg (DE); Leopold Reiter, Gilching (DE); Jochen Hopf, Haar (DE)

(73) Assignee: Delphi Deutschland GmbH (DE)

( * ) Notice: Subject to any disclaimer, the term of this patent is extended or adjusted under 35 U.S.C. 154(b) by 579 days.

(21) Appl. No.: 13/410,509

(22) Filed: Mar. 2, 2012

(65) Prior Publication Data

US 2012/0223787 A1    Sep. 6, 2012

(30) Foreign Application Priority Data

Mar. 2, 2011 (DE) .......................... 10 2011 012 811

(51) Int. Cl.
*H03H 7/20* (2006.01)
*H01P 1/18* (2006.01)

(52) U.S. Cl.
CPC . *H03H 7/20* (2013.01); *H01P 1/184* (2013.01)

(58) Field of Classification Search
CPC .................................. H03H 7/20; H01P 1/184
USPC ........................... 333/138, 139, 168, 169, 170
See application file for complete search history.

(56) References Cited

U.S. PATENT DOCUMENTS

| | | | |
|---|---|---|---|
| 3,723,918 A * | 3/1973 | Krause | 333/189 |
| 3,849,676 A | 11/1974 | Bareyt | |
| 5,014,023 A * | 5/1991 | Mantele | 333/164 |
| 5,028,892 A | 7/1991 | Daughters | |
| 6,531,935 B1 | 3/2003 | Russat et al. | |
| 6,621,370 B1 * | 9/2003 | Dao | 333/25 |
| 2005/0122253 A1 | 6/2005 | Steinbuch | |

FOREIGN PATENT DOCUMENTS

| | | |
|---|---|---|
| DE | 2352569 | 5/1974 |
| DE | 38 02 662 | 8/1989 |
| DE | 691 27 128 | 2/1998 |
| DE | 699 01 449 | 11/2002 |
| DE | 103 47 414 | 5/2005 |
| EP | 0 687 062 | 12/1975 |

OTHER PUBLICATIONS

Machine Translation in English of DE 3802662.
Machine Translation in English of EP 0 687 062.

* cited by examiner

*Primary Examiner* — Benny Lee
*Assistant Examiner* — Jorge Salazar, Jr.

(57) ABSTRACT

A high-frequency phase shifter for varying the phase between its high-frequency input signal and its output signal by the transmission phase Φ, consisting of a two-port network which is symmetrical in relation to input and output and which with respect to its high-frequency properties consists of three two-terminal networks consisting of low-loss reactances, wherein at least one of the two-terminal networks is arranged in a series circuit as a two-terminal network in series with one of the connecting ports and at least one of the two-terminal networks is arranged in a parallel circuit as a two-terminal network in parallel with the two-port earth, so that a symmetrical T-circuit or a symmetrical π circuit is provided.

10 Claims, 8 Drawing Sheets

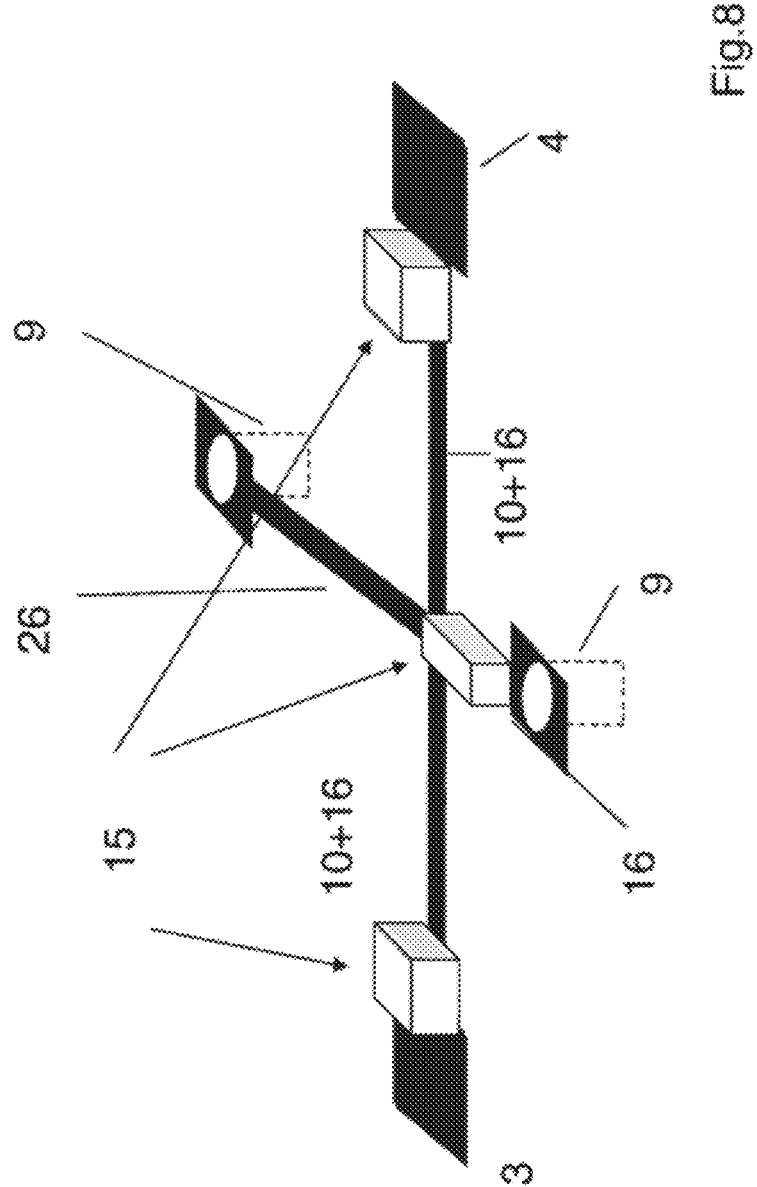

ANALOG PHASE SHIFTER

RELATED APPLICATIONS

The present invention claims priority to foreign patent application DE 102011012811.5 filed on 2 Mar. 2011.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The invention relates to a high-frequency phase shifter for varying the phase between its high-frequency input signal and its output signal by the transmission phase Φ, consisting of a two-port network which is symmetrical in relation to input and output and which with respect to its high-frequency properties consists of three two-terminal networks consisting of low-loss reactances, wherein at least one of the two-terminal networks is arranged in a series circuit as a two-terminal network in series with one of the connecting ports and at least one of the two-terminal networks is arranged in a parallel circuit as a two-terminal network in parallel with the two-port earth, so that a symmetrical T-circuit or a symmetrical π circuit is provided.

BACKGROUND OF THE INVENTION

High-frequency phase shifters are used for example in antenna technology for phase-controlled antennae to swivel the radiation pattern or to shape it. In this case there is usually the requirement to enable swivelling of the radiation pattern electronically. This leads to the demand for a high-frequency phase shifter which is electronically controllable in its transmission phase Φ.

A phase shifter for electronic variation of the phase is known from DE 3802662A1. This consists of a series phase shifter assembly, the range of variation of the individual phase shifters being small. The phase is in this case varied by means of switched diodes. For continuous tracking of the radiation pattern of an antenna, however, it is desirable to vary the phase continuously, i.e. in analogue fashion, by means of an electrical signal. A phase shifter which is variable in the transmission phase Φ electronically and in analogue fashion is known from DE69127128. The phase shifter consists of a four-terminal hybrid circuit with a branch line connected to only two variable-capacitance diodes or varactors of which the capacitance value is varied by means of a control voltage. A structure of this kind is admittedly able to sweep a large angular range of the phase, but with only two variable-capacitance diodes it does not allow appropriate compensation of the influences, to the effect that, on the input and output sides, adequate reflection loss is achieved in relation to a reference characteristic impedance Z0 on the input and output sides.

SUMMARY OF THE INVENTION

It is therefore the object of the present invention to provide a high-frequency phase shifter of which the transmission phase Φ is electronically controllable and, with ease of implementation, variable in analogue fashion over a wide angular range and with particularly low mismatching.

BRIEF DESCRIPTION OF THE DRAWINGS

Practical examples of the invention are shown in the drawings and described in more detail below. In detail they show:

FIG. 1a: symmetrical phase shifter with T-structure, formed from the two two-terminal networks 6 in series, and FIG. 1b: symmetrical phase shifter with π structure formed from two two-terminal networks 7 in parallel and a two-terminal network 6 in series.

FIG. 4a shows a variable-capacitance diode 15 or a varactor 15 with a self-inductance 18, wherein a compensating series inductance 16 is connected in series in such a way that adaptation of the range of variation of the diode capacitance value to the range of variation of the capacitance element 12, 13 concerned is provided, and FIG. 4b shows a parallel inductance connected in parallel with the diode.

FIG. 6a: transmission loss in dB of a phase shifter which is optimised in its range of phase variation and its transmission loss according to FIG. 3 with variable-capacitance diodes 15 of identical construction in all branches as a function of the tuned capacitance value C(k) of the capacitance elements 14 caused by the tuned voltage U FIG. 6b: input reflection factor in dB of the phase shifter as a function of the capacitance value C(k) of the capacitance elements 14.

FIG. 8: phase shifter as a symmetrical two-port 2, as in FIG. 3, made by microstrip conductor technology.

DESCRIPTION OF THE PREFERRED EMBODIMENT

Figure 1:
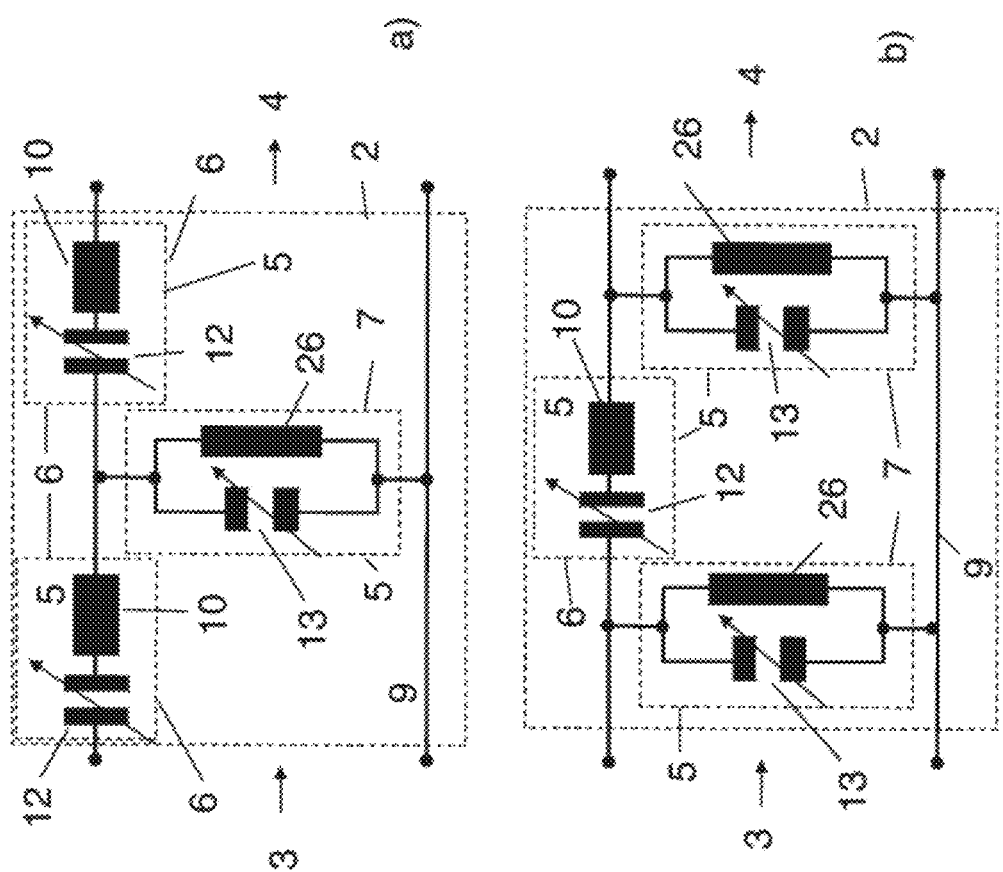
FIGS. 1a and 1b: basic forms of a phase shifter according to the invention

The high-frequency phase shifter shown in FIG. 1a and FIG. 1b as a symmetrical two-port 2 with its input 3 and its output 4, consisting of 3 two-terminal networks 5 as a T-circuit in FIG. 1a and as an circuit in FIG. 1b, with suitable dimensioning has a particularly advantageously large range of variation of the transmission phase Φ with particularly low reflection loss. Here, all reactance elements are assumed to be low-loss. At the same time it must be particularly emphasized that the presence of the capacitance elements 12, 13, which are electrically variable in their capacitance value both in the two-terminal networks 6 in series and in the two-terminal networks 7 in parallel, according to the invention affords the possibility of compensating to a particularly large extent the reflection at the ports caused by simultaneous variation of all capacitance values. Here it is of particular advantage that this aim is also achieved if all variable capacitance elements 12, 13 are the same in the two terminal networks 6 in series and the two-terminal networks 7 in parallel, so that they can be embodied very advantageously by the same variable capacitance diodes 15 or varactors. In this way capacitance elements which have low variance from each other and are formed on a semiconductor substrate can be used. The phase shifter already mentioned above and shown in DE 3802662A1 contains four high-frequency inductances. Its transmission phase is varied with only two variable-capacitance diodes. As a result a lower reflection loss is achieved, compared with the phase shifter of the present invention. As an added advantage over this state of the art, with the phase shifter according to the invention only three instead of four fixed inductances are used. By contrast with inductances, variable-capacitance diodes can be produced without high demand for surface area on a semiconductor substrate. In particular for producing a phase shifter in integrated technology, it is therefore substantially more economical to produce one inductance less and, in return, one variable-capacitance diode more on a substrate.

The principal characteristics of the phase shifter 1 according to the invention are that each two-terminal network 7 in series consists of the series circuit comprising an identical fixed inductance 10 in series and an identical series capacitance element 12 which is electrically variable in its capacitance value each two-terminal network 7 in parallel consists of the parallel circuit comprising an identical fixed inductance 26 in parallel and an identical parallel capacitance element 13 which is electrically variable in its capacitance value and all capacitance elements in the symmetrical two-port 2 are varied in their capacitance value by the same tuning voltage U for variation of the transmission phase Φ of the two-port 2.

All two-terminal networks 6 in series of the phase shifters in FIGS. 1a and 1b are, with respect to their basic structure, designed as series resonant circuits tunable in their resonant frequency, with a fixed inductance 10 in series. Similarly all two-terminal networks 7 in parallel are, with respect to their basic structure, designed as parallel resonant circuits tunable in their resonant frequency, with a fixed inductance 26 in parallel, so that in each case there is a two-port 2 with the known basic structure of a resonant band-pass filter.

By contrast with the resonant band-pass filter, of which the reflection loss is supposed to be low in a wider frequency range, for the phase shifter it is required that, in the vicinity of a discrete frequency f, it enables the transmission phase Φ variably, in each case with a high reflection loss.

To accomplish this, special dimensioning of all reactance elements 8 of the two-port 2 is necessary for a phase shifter according to the present invention.

To approach this, suitable standardization for the reactance elements is carried out below for the elements in FIGS. 1a and 1b.

For this, the fixed inductances 10 in series are denoted Ls and the fixed inductances 26 in parallel are denoted Lp. Furthermore, series and parallel capacitance elements 12, 13, 14 the same as each other, of which the capacitance value, depending on the tuning voltage U, has a value of C(U), are assumed.

Standardisation lies in the following definitions:
Let L0 be the geometric mean of Ls and Lp, so that:

$$L0 = \sqrt{Ls*Lp}$$

Let Ls be m times and L0 and Lp 1/m times as great as L0, so that:
Ls=m*L0 and Lp=1/m*L0

Let C0 be the capacitance value which together with the value L0 fulfils the resonance condition at the operating frequency f of the phase shifter, so that:

$$C0 = \frac{1}{(2*\pi*f)^2 * L0}$$

Furthermore, let the resonant reactance referred to the reference characteristic impedance Z0 and formed from L0 and C0 be denoted X0, so that:

$$X0 = \frac{\sqrt{\frac{L0}{C0}}}{Z0}$$

For the effective capacitance value C(U) of the capacitance elements 14 or variable-capacitance diodes 15 which is varied by the tuning voltage U, the following shall hold true:

$$C(U) = k*C0$$

where k is varied by the tuning voltage U.

Hence for the reference resonant frequency frs of the series resonant circuit we have:

$$frs = \frac{1}{2\pi * \sqrt{C*L} \sqrt{m*k}}$$

and the reference resonant frequency frp of the parallel resonant circuit is:

$$frp = \frac{1}{2\pi * \sqrt{C*L}} * \sqrt{\frac{m}{k}}$$

For the reactance value of the two-terminal network 6 in series, referred to Z0, we have as a function of X0, m and k:

$$Xr = (m - 1/k)*X0$$

and the susceptance of the two-terminal network 5 in parallel, referred to 1/Z0, is:

$$Br = (k - m)/X0$$

Depending on the quantities X0, m and the setting k for the complex transmission factor S21 of the T-structure circuit in FIG. 1a, the following relationship:

$$S21 = \frac{1}{1 + jXr + \frac{jBr}{2}*(1 + jXr)^2} \quad \text{where } j = \sqrt{-1}$$

By variation of the quantities X0 and m, the phase shifter can be optimised according to the respective requirements with respect to the extent of variation of the transmission phase Φ, taking the reflection loss into consideration. With the argument of S21, we have the transmission phase Φ. If the components are low-loss, the reflection factor is obtained from the amount of S21 with $$S11 = \sqrt{1 - S21^2}$$

Figure 2:
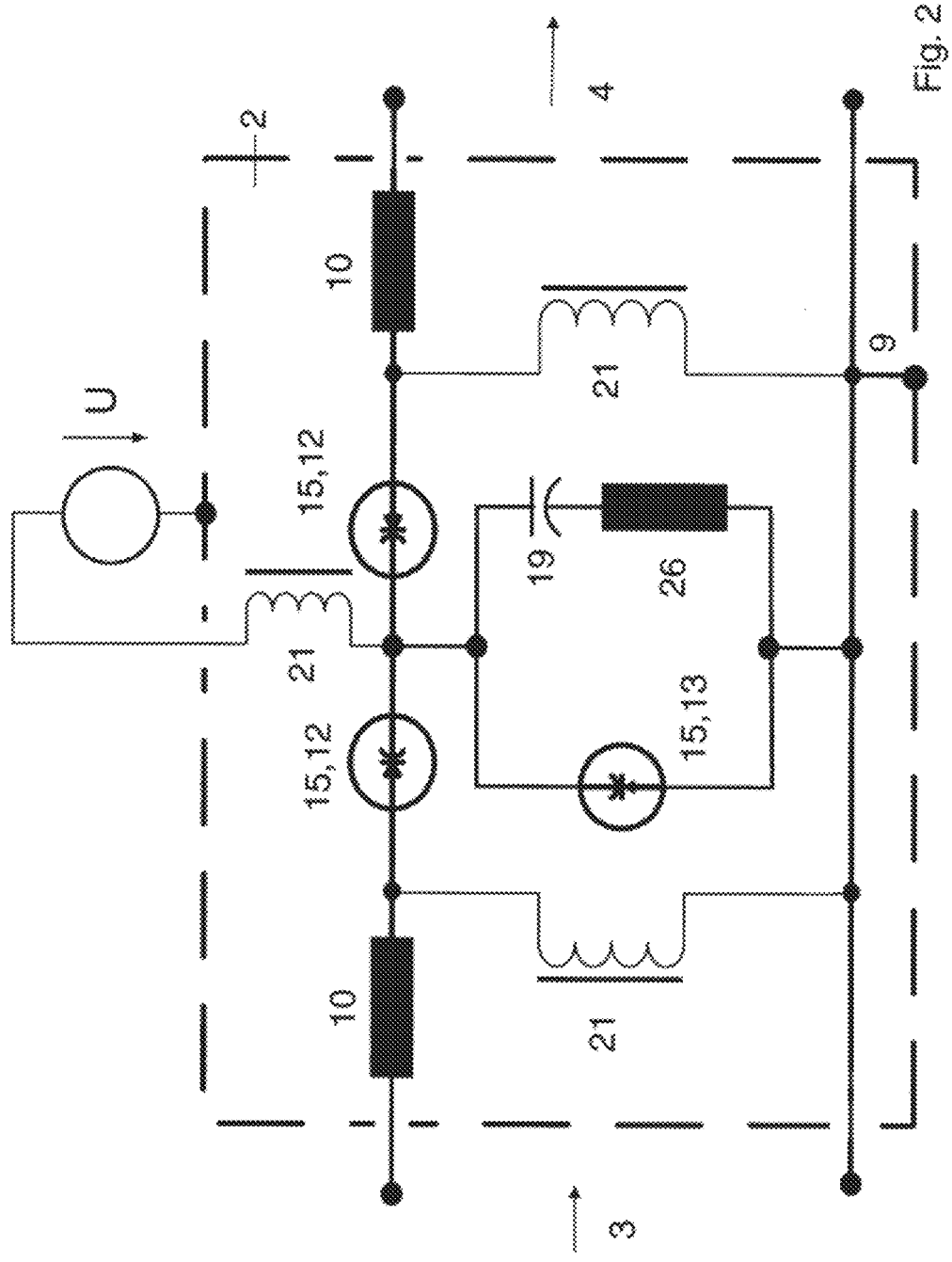
FIG. 2: phase shifter according to the invention with T-structure with a variable-capacitance diode 15 as a series capacitance element 12 variable in its capacitance value in each of the two two-terminal networks 6 in series with a variable-capacitance diode 15.
Figure 3:
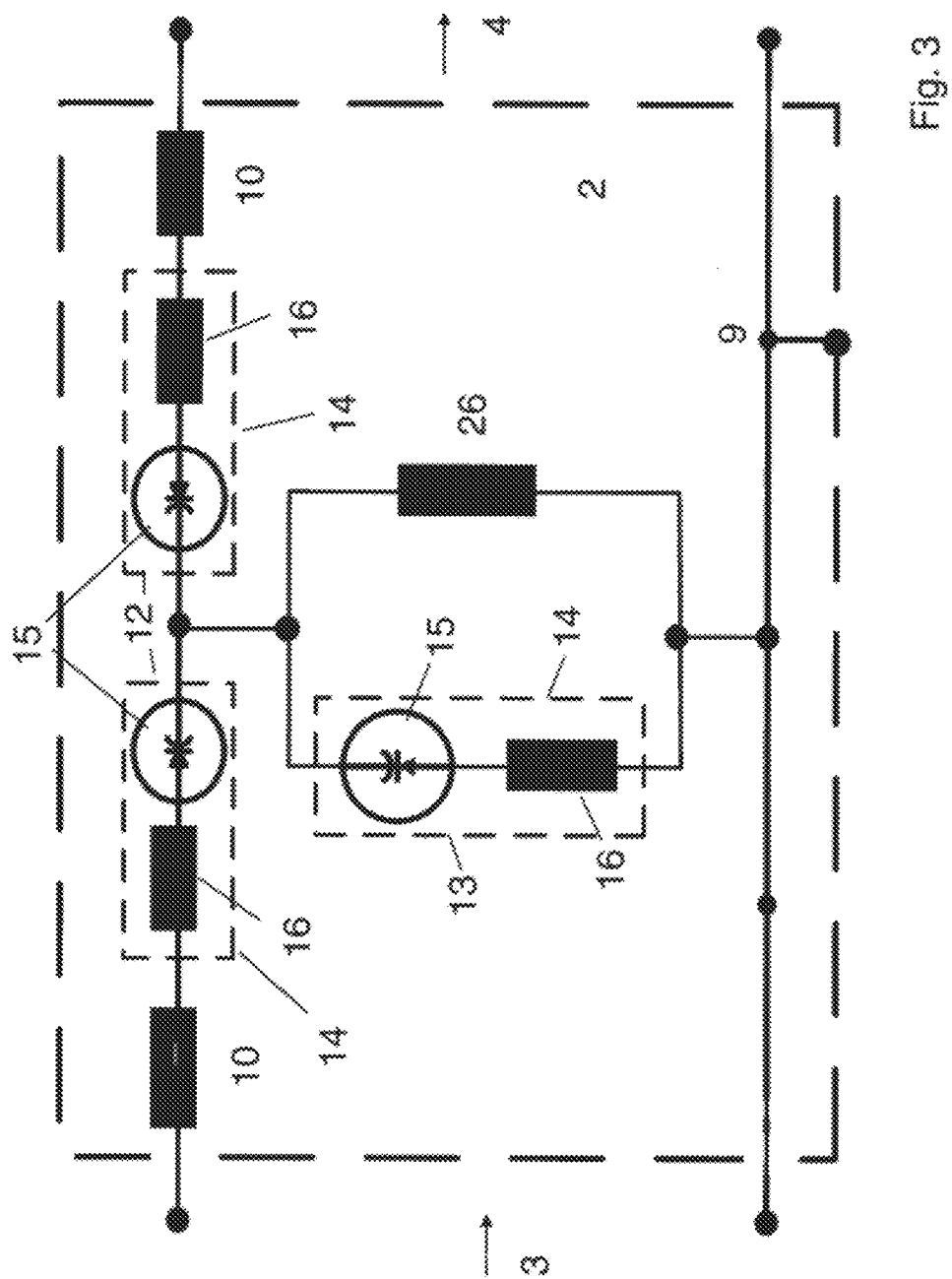
FIG. 3: shows the phase shifter according to the invention with T-circuit as in FIG. 2, but without supply of the control voltage U.
Figure 6:
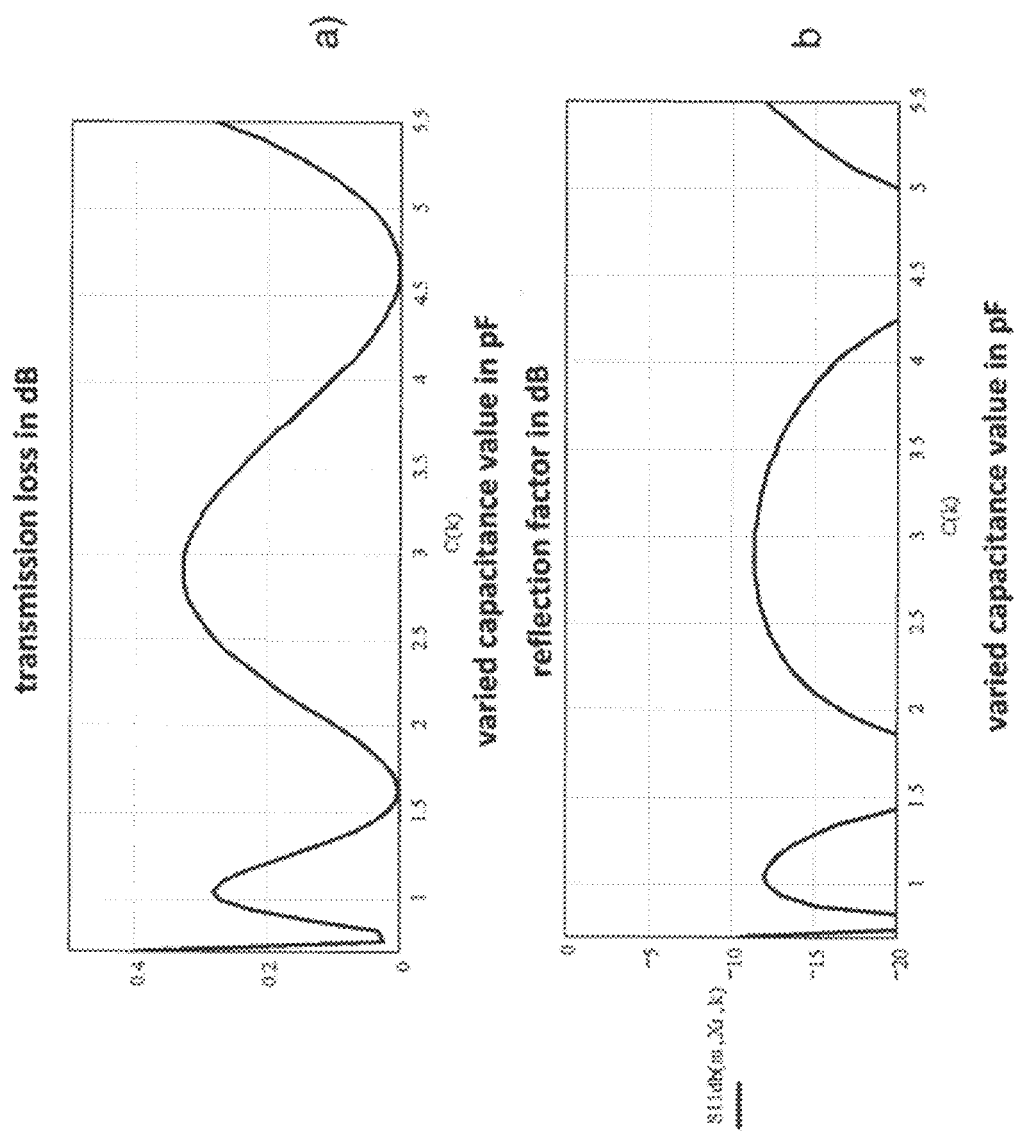
FIGS. 6a and 6b.
Figure 7:
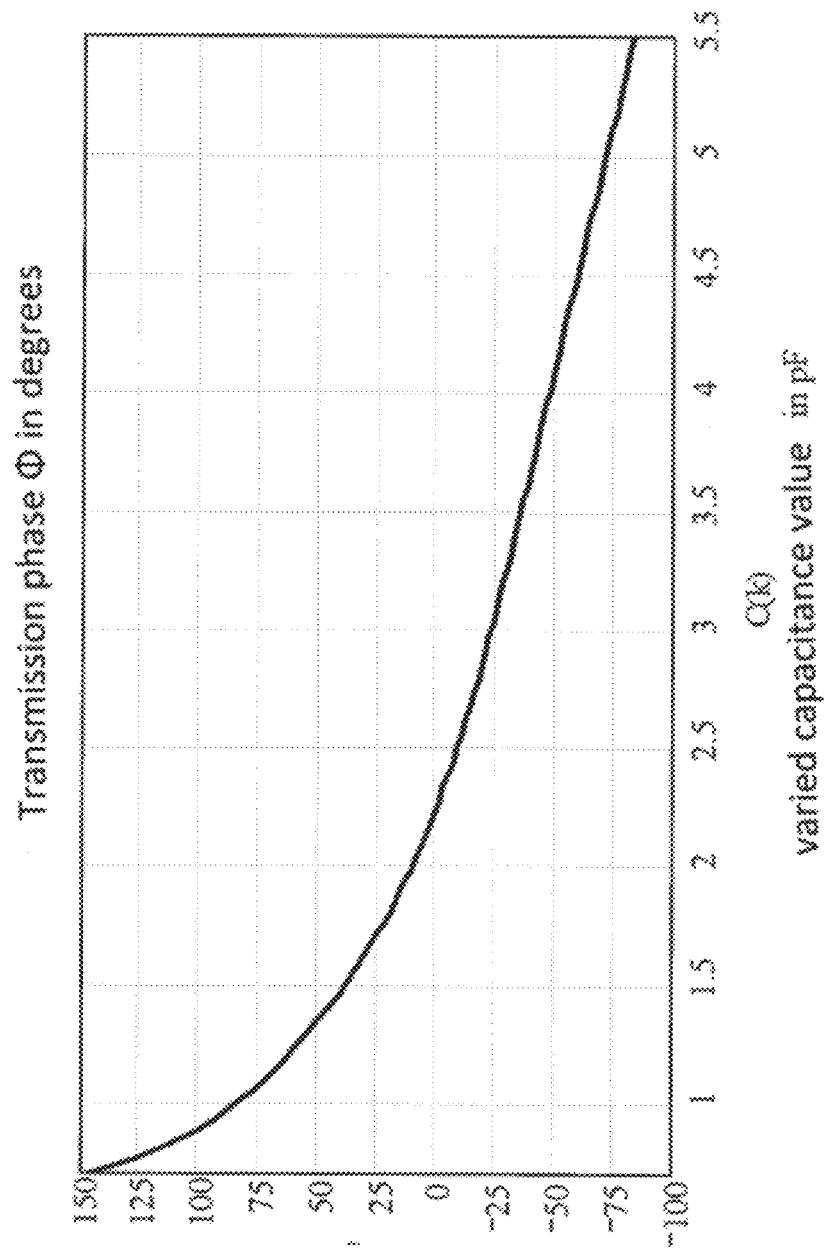
FIG. 7: transmission phase Φ of the optimised phase shifter in FIGS. 6a and 6b as a function of the capacitance value C(k) of the variable-capacitance diodes 15.

In FIGS. 6a, 6b, and 7 are shown by way of example the results which can be obtained with a phase shifter according to FIGS. 2 and 3. Here, FIG. 6 shows the transmission phase $\Phi$ of a phase shifter optimised with respect to the extent of phase variation and reflection loss, as a function of the capacitance value C(k) of the variable-capacitance diodes 15. The corresponding resulting reflection loss as well as the transmission loss are shown in FIGS. 6a and 6b. Particularly noteworthy here is the wide range of variation of the transmission phase $\Phi$ of nearly 200° which can be achieved in conjunction with a transmission loss of only 0.3 dB in the whole of the tuning range.

In FIG. 2 the phase shifter from FIG. 1a is shown in more detail. The series capacitance elements 12 and the parallel capacitance element 13 are designed as variable-capacitance diodes 15 the same as each other. The tuning voltage U for varying the transmission phase $\Phi$ of the phase shifter is delivered to the node 20 and hence to the variable-capacitance diodes 15 on the one hand via the high-frequency choke coil 21 and on the other hand via the two-port earth 9. The two variable-capacitance diodes 15 in the two two-terminal networks 6 in series receive the earth potential via the two high-frequency choke coils 21 which have high resistance at high frequency. The form of supply to the variable-capacitance diodes 15 which is shown is merely an example. It is in general determined rather by the technology which is used to produce the phase shifter. Therefore in the following figures, generation of the bias voltage of the variable-capacitance diodes 15 or varactors of the phase shifter is not shown.

Figure 4:
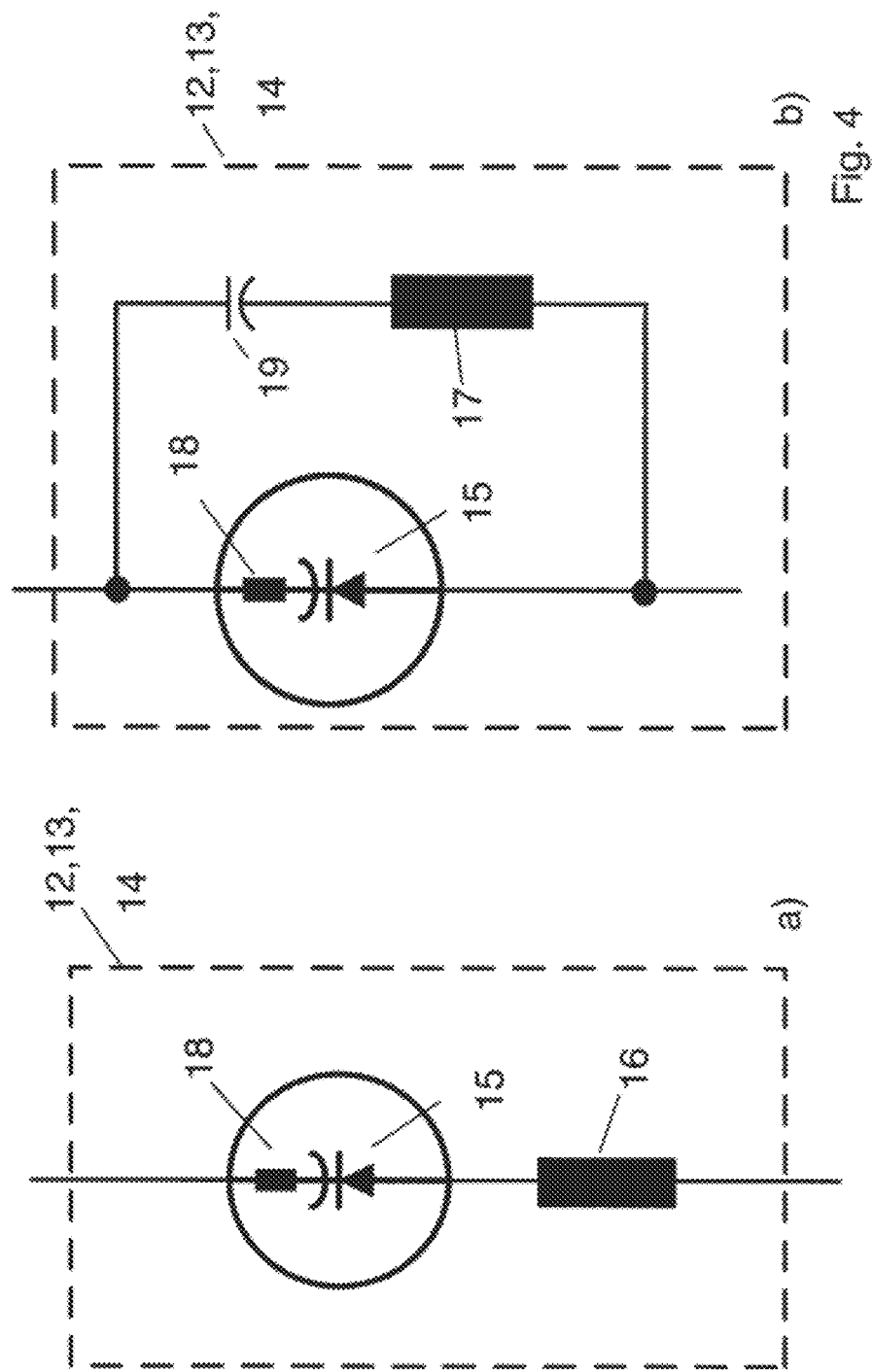
FIGS. 4a and 4b.

Often it is necessary to adapt the range of variation of the capacitance value CD(U) of a variable-capacitance diode 15 to the required range of variation of the effective capacitance C(U) of the capacitance elements 14 to achieve the required range of variation of the transmission phase $\Phi$. In FIG. 4a is shown a variable-capacitance diode 15 with its self-inductance 18. Basically, this self-inductance is below the natural resonant frequency, increasing to the range of variation of the capacitance of the component. As a rule, however, it is frequently necessary to increase the range of variation of the capacitance C(U) of the capacitance elements 14 by series connection of a compensating series inductance 16 to the variable-capacitance diode 15. If CD(U) is the capacitance of the inner variable-capacitance diode 15 and LS is the effective series inductance, consisting of the self-inductance 18 of the component and the compensating series inductance 16 together, then the effective capacitance value C(U) of the capacitance element 14 is obtained as:

$$C(U) = CD(U) * \frac{1}{1 - (2\pi f)^2 * LS * CD(U)}$$

If the self-inductance 18 of the variable-capacitance diode is too high, it may be necessary to narrow the range of variation of the effective capacitance value C(U) by parallel connection of a compensating parallel inductance 18 via a bypass capacitor 19, as shown in FIG. 4b.

In FIG. 3 are shown the capacitance elements 4 which are the same as each other, each with a compensating series inductance 16. To produce the phase shifter, in the two-terminal networks 6 in series the fixed inductance 10 in series and the compensating inductance 16 in series are in each case appropriately combined into one component.

For frequencies in the gigahertz frequency range, the high-frequency phase shifter 1 may advantageously be constructed in microstrip conductor technology as a symmetrical two-port 2, as shown in FIG. 8. Here, the fixed inductances 10 in series and the compensating inductances 16 in series and fixed inductance 26 in parallel are structured as short electrical wires.

Figure 5:
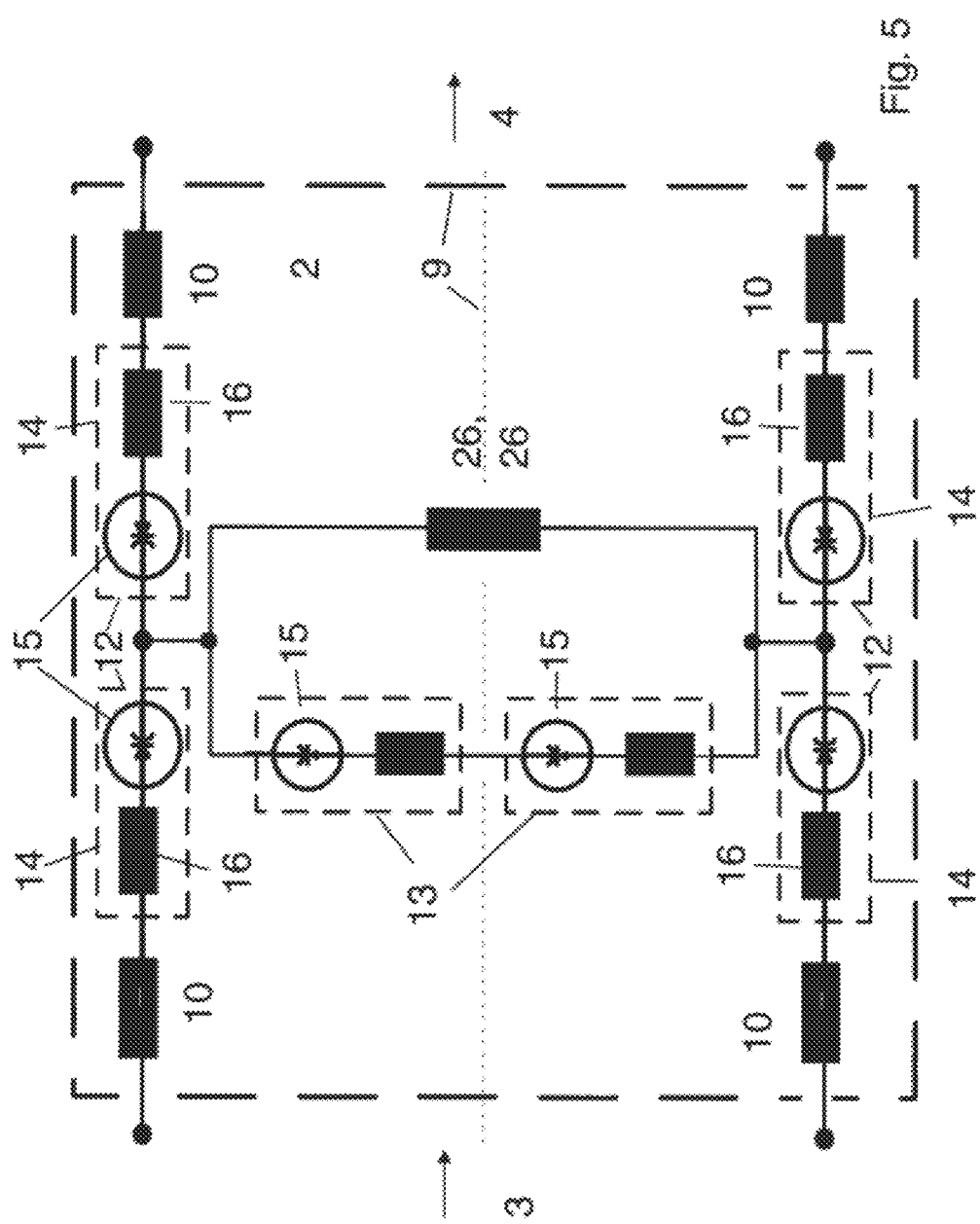
FIG. 5: phase shifter according to the invention with T-circuit as in FIG. 3, but with symmetrical, i.e. differential input 3 and differential output 4 of the two-port 2.

In FIG. 5 the high-frequency phase shifter is designed as a differential phase shifter with input and output symmetrical in relation to the two-port earth 9, in such a way that the symmetrical two-port 4 is reflected at the two-port earth 9, so that in each case the two fixed inductances 26 in parallel in the two-terminal networks 7 in parallel are combined into a common fixed inductance 27 in parallel, and also the series-connected variable-capacitance diodes 15 are combined into a parallel capacitance element 13. Symmetrical arrangements of this kind are particularly suitable for the technology of integrated circuits. The reactances and in particular the variable-capacitance diodes 15 are manufactured on a semiconductor substrate in the interests of low variance of the capacitance values from each other.

The invention claimed is:

1. A high-frequency phase shifter operative to vary a phase between a high-frequency input signal and an output signal by transmission phase $\Phi$, comprising a two-port network having an input and an output and which, with respect to high-frequency properties of the two-port network, comprises three two-terminal networks having low-loss reactances, wherein at least one of the three two-terminal networks is arranged in a series circuit as a two-terminal network in series with one of the input or output and at least one of the three two-terminal networks is arranged in a parallel circuit as a two-terminal network in parallel with an earth terminal of the two-port network, so that a T circuit or a π circuit is provided, wherein
    each two-terminal network in series comprises a respective identical fixed inductance connected in series with a respective identical series capacitance element having an electrically identical capacitance value,
    each two-terminal network in parallel includes a respective identical fixed inductance connected in parallel with a respective identical parallel capacitance element having an electrically identical capacitance value, and
    all capacitance elements in the two-port network are adjusted in their respective capacitance values by the same tuning voltage U for variation of the transmission phase $\Phi$ of the two-port network, wherein each of the at least one series capacitance element and the at least one parallel capacitance element of the three two-terminal networks includes at least one variable-capacitance diode, and depending on the tuning voltage U—apart from the technical variance between the variable-capacitance diodes—the same capacitance value C(U) for each of the capacitance elements is set.

2. The phase shifter of claim 1, wherein, if the at least one variable-capacitance diode of the at least one series capacitance element includes a plurality of variable-capacitance diodes, the plurality of variable-capacitance diodes have an are identical capacitance and are connected in series with each other, and wherein, if the at least one variable-capacitance diode of the at least one parallel capacitance element includes a plurality of variable-capacitance diodes, the plurality of variable-capacitance diodes have an identical capacitance and are connected in parallel with each other.

3. The phase shifter of claim 1, wherein the high-frequency phase shifter is designed for frequencies using the gigahertz frequency range and the two-port network is constructed in microstrip conductor technology and the at least one fixed inductance in series and the at least one fixed inductance in parallel are constructed as respective short electrical wires.

4. The phase shifter of claim 1, wherein a respective compensating series inductance is connected in series with each of the variable-capacitance diodes in the corresponding capacitance elements for adaptation of a range of variation of their diode capacitance value CD(U) to the range of variation of the respective capacitance element.

5. The phase shifter of claim 1, wherein, in case of excessive unavoidable self-inductance of the variable-capacitance diodes, a compensating parallel inductance is connected in parallel via a bypass capacitor in the capacitance elements for adaptation of a range of variation of their diode capacitance value CD(U) to the range of variation of the respective capacitance element concerned.

6. The phase shifter of claim 1, wherein the two-port network is designed as the T-circuit with two two-terminal networks in series identical with each other and with one two-terminal network in parallel.

7. The phase shifter of claim 6, wherein the two-terminal network in parallel leads from a common node of the two two-terminal networks in series identical with each other and of the two-terminal network in parallel, to the earth terminal, and the variable-capacitance diodes of the three two-terminal networks are connected each by the same one of their electrodes to the common node to which the tuning voltage U prevailing at the earth terminal is delivered via a high-frequency choke coil, and to the other electrodes of the variable-capacitance diodes is delivered by means of blocking capacitors via high-frequency choke coils in each case the two-port earth.

8. The phase shifter of claim 1, wherein the two-port network is designed as the π circuit with two two-terminal networks in parallel identical with each other and with one two-terminal network in series.

9. A high-frequency phase shifter operative to vary a phase between a high-frequency input signal and an output signal by a transmission phase Φ, comprising a two-port network having an input and an output and which, with respect to high-frequency properties of the two-port network, comprises three two-terminal networks having low-loss reactances, wherein at least one of the three two-terminal networks is arranged in a series circuit as a two-terminal network in series with one of the input or output and at least one of the two-terminal networks is arranged in a parallel circuit as a two-terminal network in parallel with an earth terminal of the two-port network, so that a T circuit or a π circuit is provided, wherein each two-terminal network in series includes a respective identical fixed inductance connected in series with a respective identical series capacitance element having an electrically variable capacitance value, each two-terminal network in parallel includes a respective identical fixed inductance connected in parallel with a respective identical parallel capacitance element having an electrically variable capacitance value, and all capacitance elements in the two-port network are adjusted in their respective capacitance values by the same tuning voltage U for variation of the transmission phase Φ of the two-port network, wherein the high-frequency phase shifter is designed as a differential phase shifter so that in each case the two fixed inductances in parallel in the π circuit are combined into a common fixed inductance and in the T circuit the series-connected variable-capacitance diodes are combined into a parallel capacitance element.

10. The phase shifter of claim 9, wherein the high-frequency phase shifter is constructed in integrated circuit technology and the reactances and the variable-capacitance diodes of the three two-terminal networks are manufactured on a semiconductor substrate in the interests of low variance of the capacitance values from each other.

\* \* \* \* \*